(12) United States Patent  
Sahara et al.

(10) Patent No.: US 8,476,535 B2  
(45) Date of Patent: Jul. 2, 2013

(54) MULTILAYERED PRINTED WIRING BOARD AND METHOD FOR MANUFACTURING THE SAME

(75) Inventors: Takahiro Sahara, Tokyo (JP); Atsushi Kobayashi, Tokyo (JP); Masahiko Igaue, Tokyo (JP); Kiyoshi Takeuchi, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 84 days.

(21) Appl. No.: 12/926,311

(22) Filed: Nov. 9, 2010

(65) Prior Publication Data

US 2011/0061903 A1    Mar. 17, 2011

Related U.S. Application Data

(62) Division of application No. 11/878,660, filed on Jul. 26, 2007, now abandoned.

(30) Foreign Application Priority Data

Jul. 28, 2006  (JP) ................. P2006-205640

(51) Int. Cl.  
*H05K 1/16*    (2006.01)

(52) U.S. Cl.  
USPC ............... 174/260; 174/254; 174/255

(58) Field of Classification Search  
USPC .............. 361/749, 760–766, 792–795  
See application file for complete search history.

(56) References Cited

U.S. PATENT DOCUMENTS

| 5,615,088 | A | * | 3/1997 | Mizumo ............ 361/749 |
|---|---|---|---|---|
| 6,288,343 | B1 | | 9/2001 | Ahn et al. |
| 6,734,542 | B2 | | 5/2004 | Nakatani et al. |
| 6,975,516 | B2 | | 12/2005 | Asahi et al. |
| 7,342,802 | B2 | | 3/2008 | Iijima et al. |
| 7,371,970 | B2 | | 5/2008 | Flammer et al. |
| 7,378,596 | B2 | | 5/2008 | Kawaguchi et al. |
| 7,576,288 | B2 | | 8/2009 | Kondo et al. |
| 2004/0008982 | A1 | | 1/2004 | Matsuo et al. |
| 2005/0016764 | A1 | | 1/2005 | Echigo et al. |
| 2006/0032669 | A1 | * | 2/2006 | Kawakami et al. ........ 174/261 |
| 2006/0180344 | A1 | | 8/2006 | Ito et al. |
| 2009/0014205 | A1 | | 1/2009 | Kobayashi et al. |

FOREIGN PATENT DOCUMENTS

| CN | 1461182 A | 12/2003 |
|---|---|---|
| CN | 1947475 A | 4/2007 |

(Continued)

OTHER PUBLICATIONS

Japanese Office Action of corresponding Japanese Application No. 2006-205640 mailed on Jun. 21, 2011.

(Continued)

*Primary Examiner* — Ishwarbhai Patel  
(74) *Attorney, Agent, or Firm* — Finnegan, Henderson, Farabow, Garrett & Dunner, L.L.P.

(57) ABSTRACT

A multilayered printed wiring board includes a flexible wiring board with wiring layers on both main surfaces thereof; a rigid wiring board with wiring layers on both main surfaces thereof and formed opposite to the flexible wiring board under the condition that an area of the main surface of the rigid wiring board is smaller than an area of the main surface of the flexible wiring board; and an electric/electronic component embedded in the rigid wiring board.

2 Claims, 12 Drawing Sheets

FOREIGN PATENT DOCUMENTS

| | | |
|---|---|---|
| JP | 2003-332743 | 11/2003 |
| JP | 2005-277002 | 10/2005 |
| JP | 2005-322878 | 11/2005 |
| JP | 2006-114621 | 4/2006 |
| JP | 2006-156669 | 6/2006 |
| KR | 10-2006-0135066 | 12/2006 |
| WO | WO 2005/099324 A1 | 10/2005 |

OTHER PUBLICATIONS

Office Action issued by Chinese Pastent Office on Apr. 8, 2010, for Chinese Patent Application No. 200710136750.1, and English lanugage Summary thereof.

Official communication issued by the Taiwan Patent Office in Taiwan Patent Application No. 096126397, dated Jun. 13, 2012.

* cited by examiner

FIG. 1
(a)
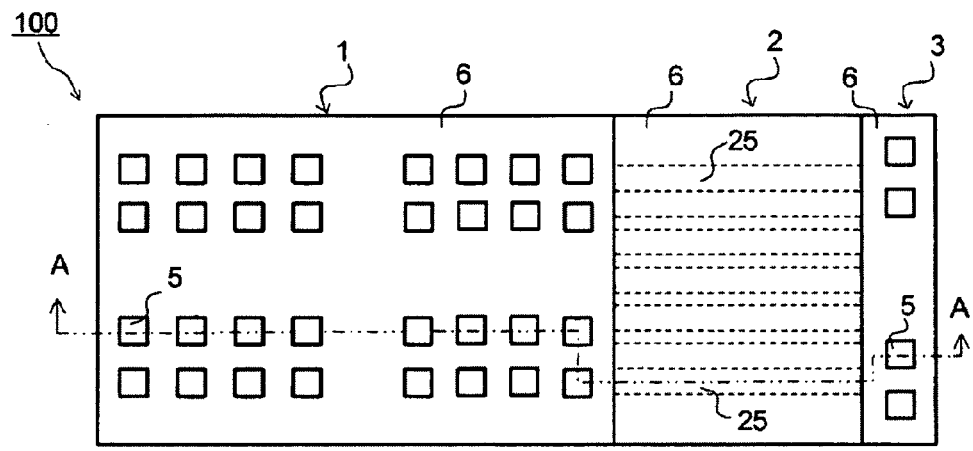
(b)
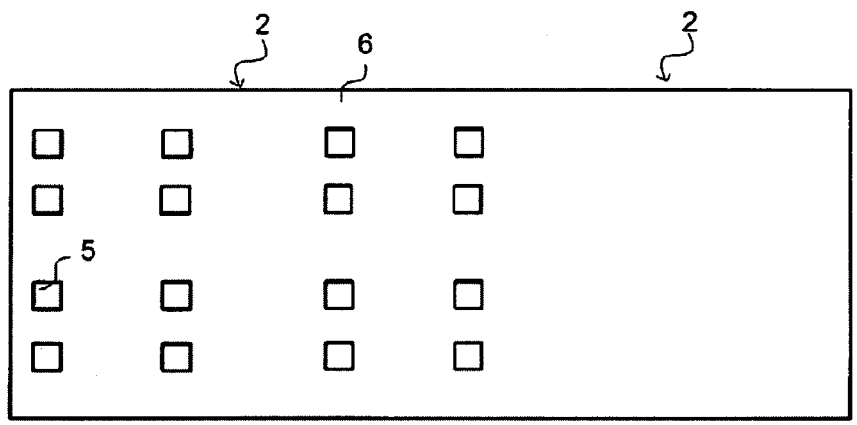
FIG. 2
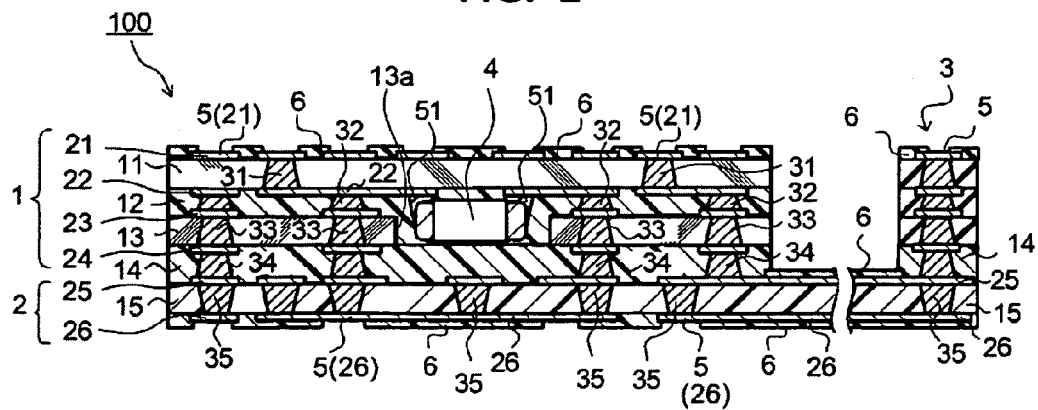

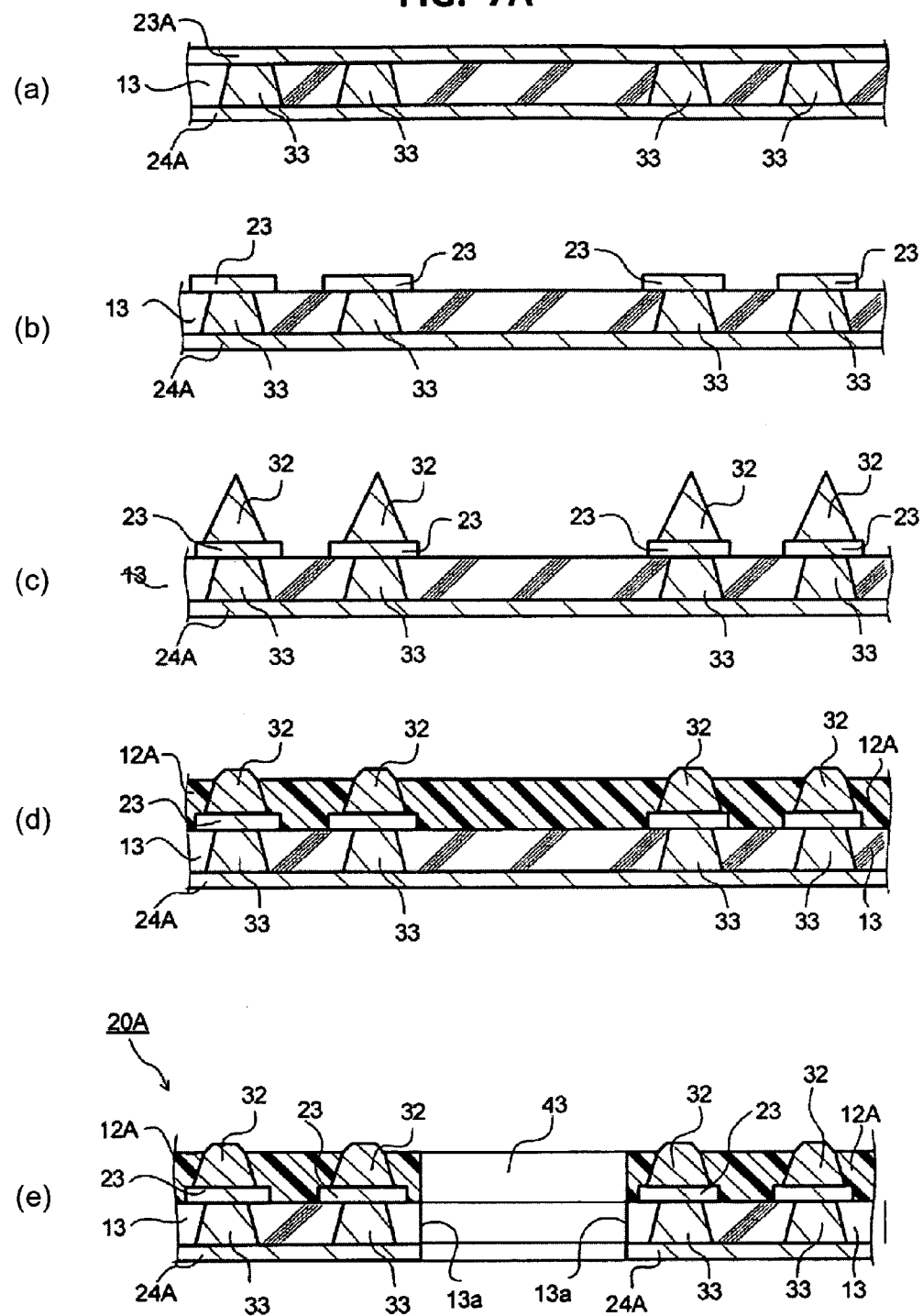

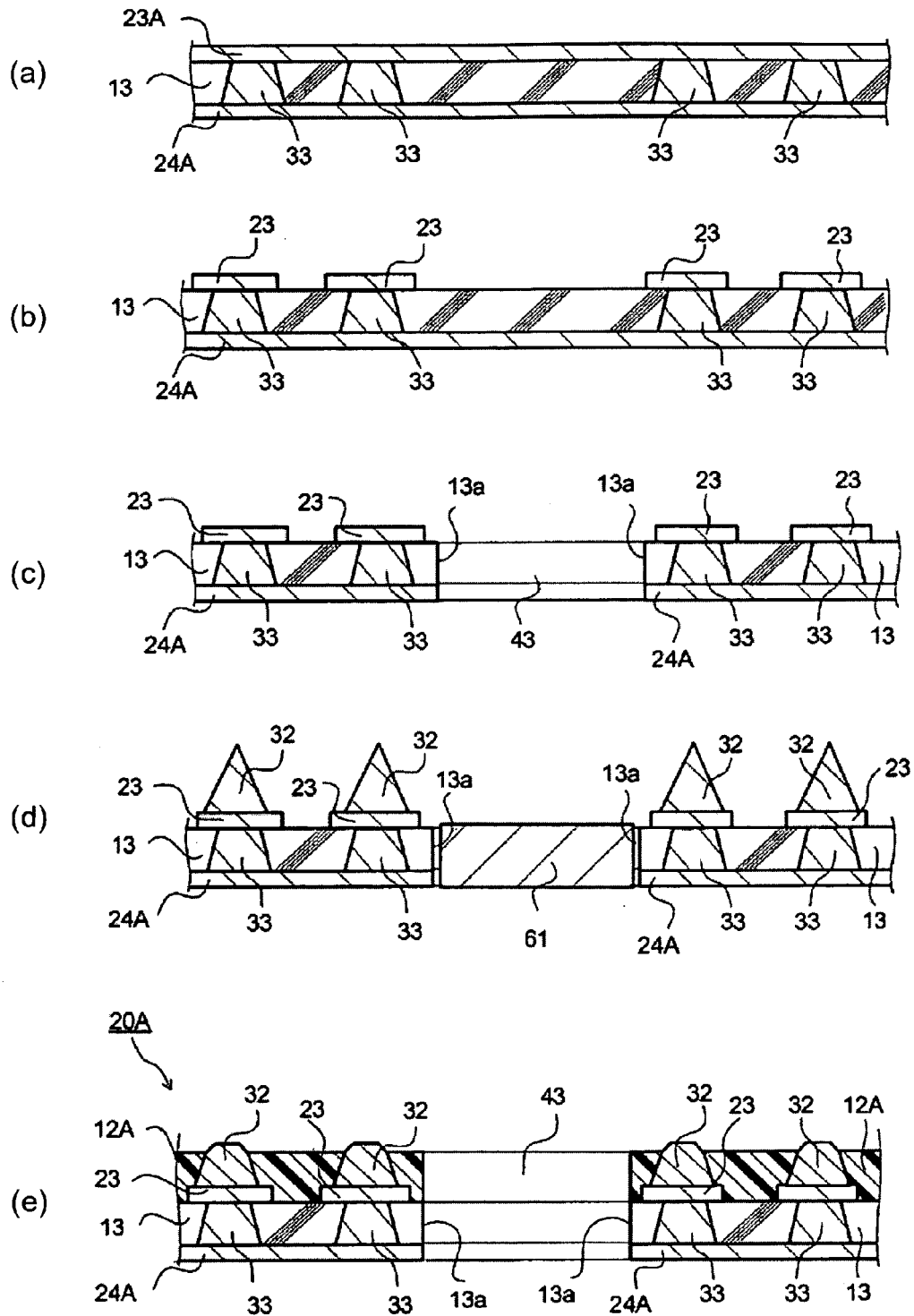

MULTILAYERED PRINTED WIRING BOARD AND METHOD FOR MANUFACTURING THE SAME

CROSS-REFERENCE TO RELATED APPLICATIONS

This is a division of application Ser. No. 11/878,660, filed Jul. 26, 2007, now abandoned which claims priority to Japanese Patent Application No. 2006-205640 filed on Jul. 28, 2006, all of which are incorporated herein by reference.

BACKGROUND

1. Field of the Invention

The present invention relates to a multilayered printed wiring board, e.g., which is employed as a module board in a portable device and a method for manufacturing the multilayered printed wiring board.

2. Description of the Related Art

Recently, the downsizing and the weight saving for a portable device such as a cellular phone are developed and moreover, the performance of the portable device is developed. In addition, some instruments are combined with one another in the portable device. In this case, a multilayered printed wiring board is employed as the module board in the portable device. In view of the above-described requirements for portable device, it is desired to downsize, thin and grow in density the multilayered printed wiring board. In addition, some hardness and flexibility are required for the multilayered printed wiring board. For example, the hardness is required to realize the mechanical strength of the multilayered printed wiring board. The flexibility is required to house the multilayered printed wiring board in a narrow case under the bending condition.

Conventionally, a rigid-flexible wiring board is employed so as to satisfy the hardness and the flexibility. The applicant proposed a new type rigid-flexible wiring board in Reference 1 so as to develop the material yield. In Reference 1, the rigid wiring board and the flexible wiring board are laminated via a semi-hardened prepreg and pressed under the heating condition. In this case, the wiring pattern of the rigid wiring board is electrically connected with the wiring pattern of the flexible wiring board via interlayer connection conductors such as conductive bumps through the prepreg. In Patent Reference 1, the intended rigid-flexible wiring board is fabricated through the above-described manufacturing process.

[Reference 1] JP-A No. 2005-322878 (KOKAI)

In Reference 1, the intended rigid-flexible wiring board can be easily fabricated from the rigid wiring board and the flexible wiring board at higher material yield, but can not satisfy the downsizing of the board because the number of electric/electronic component can not be reduced.

BRIEF SUMMARY OF THE INVENTION

In view of the above-described problems, it is an object to provide a multilayered printed wiring board wherein the number of electric/electronic component can be reduced so as to downsize the board itself and the method for manufacturing the multilayered printed wiring board.

In order to achieve the above object, an aspect of the present invention relates to a multilayered printed wiring board, including: a flexible wiring board with wiring layers on both main surfaces thereof; a rigid wiring board with wiring layers on both main surfaces thereof and formed opposite to the flexible wiring board under the condition that an area of the main surface of the rigid wiring board is smaller than an area of the main surface of the flexible wiring board; and an electric/electronic component embedded in the rigid wiring board.

In an embodiment, the multilayered printed wiring board also includes: an insulating layer disposed between the flexible wiring board and the rigid wiring board; and an interlayer connection conductor formed along an axial direction thereof and disposed between the flexible wiring board and the rigid wiring board through the insulating layer so as to electrically connect the flexible wiring board and the rigid wiring board via the wiring layers formed on the main surfaces of the flexible wiring board and the rigid wiring board; wherein a diameter of the interlayer connection conductor in the side of the rigid wiring board is set smaller than a diameter of the interlayer connection conductor in the side of the flexible wiring board.

Another aspect of the present invention relates to a multilayered printed wiring board, including: a flexible wiring board with wiring layers on both main surfaces thereof; a rigid wiring board with wiring layers on both main surfaces thereof and formed opposite to the flexible wiring board via an insulating layer; an interlayer connection conductor disposed through the insulating layer so as to electrically connect the flexible wiring board and the rigid wiring board under the condition that a forefront of the interlayer connection conductor is plastically deformed through the connection for the rigid wiring board and a bottom of the interlayer connection conductor is connected with a connection land of the wiring layer of the flexible wiring board; and an electric/electronic component embedded in the rigid wiring board.

Still another aspect of the present invention relates to a method for manufacturing a multilayered printed wiring board, comprising the steps of: preparing a first rigid board and a second rigid board; mounting an electric/electronic component on a main surface of the first rigid board; forming a roll off to house the electric/electronic component at the second rigid board; laminating the first rigid board and the second rigid board so that the electric/electronic component can be inserted in the roll off, thereby forming a rigid wiring board; and laminating the rigid wiring board and a flexible wiring board via a prepreg to be converted into an insulating layer so that the rigid wiring board can be electrically connected with the flexible wiring board via an interlayer connection conductor.

According to the aspects of the present invention, since the electric/electronic component is embedded in the rigid wiring board, the thus obtained multilayered printed wiring board can be reduced in size even though the number of electric/electronic component is not reduced. Since the multilayered printed wiring board can exhibit the hardness and the flexibility, the multilayered printed wiring board can be employed as the module board so as to realize the downsized portable device.

BRIEF DESCRIPTION OF THE SEVERAL VIEWS OF THE DRAWINGS

FIG. 1(a) is a top plan view showing the structure of a multilayered printed wiring board according to an embodiment of the present invention.

FIG. 1(b) is a bottom plan view showing the structure of a multilayered printed wiring board according to an embodiment of the present invention.

FIG. 2 is a cross sectional view showing the structure of the multilayered printed wiring board in FIG. 1, taken on line A-A.

FIG. 7A relates to cross sectional views schematically showing some steps in a manufacturing method for the rigid wiring board of the multilayered printed wiring board in FIG. 2.

FIG. 7B relates to cross sectional views schematically showing some other steps in a manufacturing method for the rigid wiring board of the multilayered printed wiring board in FIG. 2.

BEST MODE FOR IMPLEMENTING THE INVENTION

Figure 3:
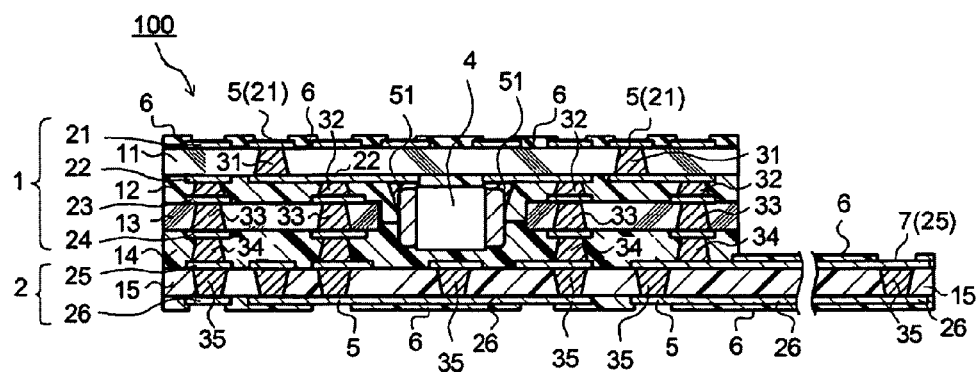
FIG. 3 is a cross sectional view showing the structure of a multilayered printed wiring board modified from the one shown in FIG. 2.

Hereinafter, the present invention will be described in detail with reference to the drawings. Like or corresponding components are designated by the same reference numerals throughout the drawings and the explanation for like or corresponding components will be omitted. The embodiments and the drawings will be described for the convenience of the understanding of the present invention so that the present invention is not limited to the embodiments and the drawings. Moreover, the drawings are schematically illustrated so that some components may be different from real ones.

Figure 4:
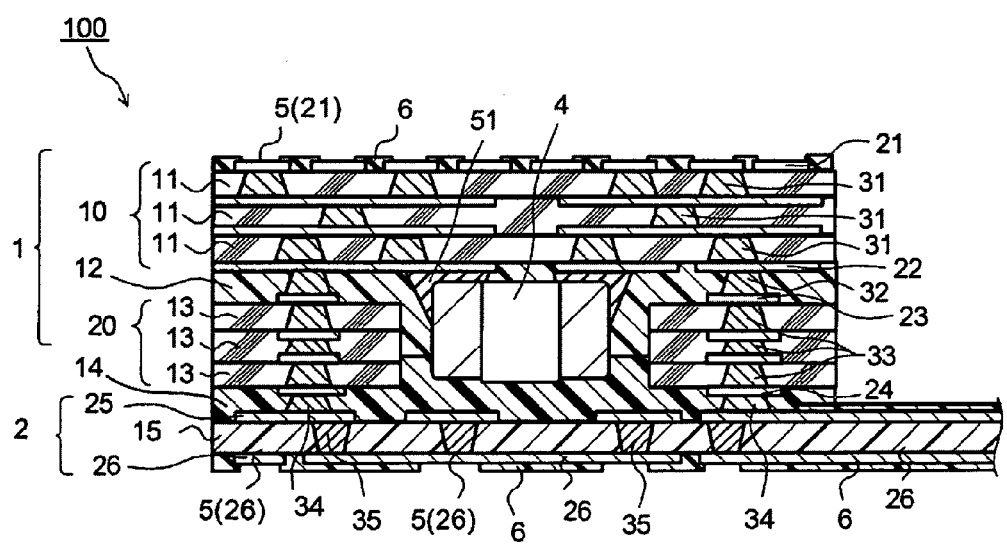
FIG. 4 is a cross sectional view showing the structure of another multilayered printed wiring board modified from the one shown in FIG. 2.

First of all, a multilayered printed wiring board according to this embodiment will be described with reference to FIGS. 1 to 4. FIG. 1(a) is a top plan view showing the structure of the multilayered printed wiring board according to this embodiment. FIG. 1(b) is a bottom plan view showing the structure of the multilayered printed wiring board according to this embodiment. FIG. 2 is a cross sectional view showing the structure of the multilayered printed wiring board in FIG. 1, taken on line A-A. FIG. 3 is a cross sectional view showing the structure of a multilayered printed wiring board modified from the one shown in FIGS. 1 and 2. FIG. 4 is a cross sectional view showing the structure of another multilayered printed wiring board modified from the one shown in FIGS. 1 and 2.

As shown in FIGS. 1 and 2, the multilayered printed wiring board 100 includes a rigid wiring board 1 with wiring layers on both main surfaces thereof, a flexible wiring board 2 with wiring layers on both main surfaces thereof and another rigid wiring board 3. The rigid wiring boards 1, 3 and the flexible wiring board 2 are combined with one another to constitute a prescribed module board. The bottom side of the multilayered printed wiring board 100 is made of the flexible board 2 entirely. The rigid boards 1 and 3 are disposed on the top surface of the flexible wiring board 2 in the long direction thereof with separated from one another. A rigid insulating layer 14 is formed between the flexible wiring board 2 and the rigid wiring board 1 and between the flexible wiring board 2 and the rigid wiring board 3. An electric/electronic component 4 is embedded in the rigid wiring board 1. Hereinafter, the "electric/electronic component" may be called as a "part".

The length of the flexible wiring board 2 is set larger than the lengths of the rigid wiring boards 1 and 3. As shown in FIG. 1, therefore, the rigid wiring boards 1 and 3 are disposed at both ends of the flexible wiring board 2 so that the multilayered printed wiring board 100 is partially constituted of the flexible wiring board 2. In this point of view, the multilayered printed wiring board 100 can exhibit the hardness due to the rigid wiring boards 1 and 3 and the flexibility due to the flexible wiring board 2.

Since the widths of the rigid wiring boards 1 and 3 is set equal to the width of the flexible wiring board 2, the bottom surface of the multilayered printed wiring board 100 can be substantially flattened. As described above, since the multilayered printed wiring board 100 is partially constituted of the flexible wiring board 2, the flexible wiring board 2 is partially exposed. The exposed portion of the flexible wiring board 2 may be slightly shortened in width in comparison with the rigid wiring boards 1 and 3. The thickness of the rigid wiring board 1 is set substantially equal to the thickness of the rigid wiring board 3. Therefore, the top surface of the multilayered printed wiring board 100 is substantially flattened except the exposed flexible wiring board 2.

The outermost wiring patterns are partially exposed from both main surfaces of the multilayered printed wiring board 100 to constitute the external terminals for packaging. The remnants of the outermost wiring patterns are covered with protective layers 6, e.g., made of solder resist. One or more electric/electronic components are electrically mounted on the external terminals. In this point of view, the external terminals function as lands for mounting the electric/electronic component(s). Since the top surface and the bottom surface of the multilayered printed wiring board are flattened, the electric/electronic component(s) can be easily mounted on the multilayered printed wiring board without any disturbance due to the convex portions of the top surface and the bottom surface thereof. Herein, the surface patterning structure is exemplified in this embodiment, and thus, not restricted to the exemplified one. Moreover, the rigid wiring boards 1 and 3 are constituted as a four-layered structure, but may be as another layered structure. For example, the rigid wiring boards 1 and 3 may be constituted as an eight-layered structure as shown in FIG. 4.

Although the concrete size of the multilayered printed wiring board 100 is not limited, the concrete size may be set almost equal to the size of a normal module board to be housed into a portable device.

As shown in FIG. 3, the multilayered printed wiring board 100 may be constituted so as not to contain the rigid wiring board 3. In this case, the right edge of the flexible wiring board 2 may be used as a connection terminal for another component or board. Moreover, the part may be embedded in the rigid wiring board 3. Since the rigid wiring board 3 may be constructed in the same manner as the rigid wiring board 1, the explanation for the rigid wiring board 3 may be omitted.

As the part 4 to be embedded may be exemplified a passive component such as a chip resistor, a chip conductor, a chip inductance and an active component such as a bare chip to be flip chip-bonded. The size of the part 4 may be set to 0.4 mm×0.2 mm (0402) or 0.6 mm×0.3 mm (0603). Since the thickness of the exemplified part is almost equal to the narrow side of the part, the exemplified part can be embedded into the rigid wiring board with a thickness of about 0.5 mm.

As shown in FIGS. 1 to 4, in the multilayered printed wiring board 100 of this embodiment, the part 4 is disposed in the rigid wiring board 1 so as to be opposite to the lands for packaging as portions of the inner wiring layer 22. The electrode terminals 4a of the part 4 are electrically connected with the lands of the wiring layer 22 via the connection 51. In this way, the part 4 can be embedded in the rigid wiring board 1. In this case, the part 4 is faced against the flexible wiring board 2.

The connection 51 is made of solder cream, e.g., with a melting point of 200 to 240° C. higher than a melting point of a normal solder to be used in the packaging and connection for another electronic component. In this case, the connection 51 can not be re-melted in the packaging and connection for another electronic component.

As shown in FIG. 2, an insulating layer 11 is formed in plane outside from the wiring layer 22 so as to form a base for mounting the part 4 via the wiring layer 22. The insulating layer 11 is formed in advance before the part 4 is mounted. In this point of view, the insulating layer 11 may be called as a "first rigid board". The part 4 is surrounded by insulating layers 12 and 13. In other words, the part 4 is embedded in the insulating layers 12 and 13. The insulating layer 13 constitutes a rigid board so that a predetermined area of the insulating layer 13 is removed in accordance with the position, the size and the outer shape of the part 4. In this point of view, the part 4 is disposed in the removed area, that is, the roll off 13a of the insulating layer 13. As a result, the insulating layer 13 functions as a second rigid board for embedding the part 4 therein.

The insulating layers 11 to 14 may be made from the respective prepregs. Each prepreg may be made of a base of glass fiber nonwoven material, organic fiber nonwoven material or paper and an unhardened epoxy resin, polyimide resin, bismaleimide resin or phenol resin which is infiltrated into the base. Concretely, glass cloth-epoxy based prepreg may be exemplified. Since the insulating layer 15 is flexible, the insulating layer 15 is made from a flexible prepreg for a flexible board. The flexible prepreg is made of a base of glass cloth or the like and a resin such as polyimide resin flexible even after hardening.

The thickness of each insulating layer may be set within a range of 50 to 120 µm when the thickness of the part 4 is set to about 0.2 mm. The thickness of each insulating layer may be set within a range of 80 to 160 µm when the thickness of the part 4 is set to about 0.3 mm. However, the thickness of each insulating layer may be set within a given range in view of the thickness of the part 4. In this case, the thickness of the prepreg corresponding to the insulating layer is set within a thickness range similar to the thickness range of the insulating layer. Therefore, the thickness of the prepregs of the insulating layers 12 and 13 may be set larger than another prepreg of another insulating layer in order to embed the part 4 in the insulating layers 12 and 13 without fail.

The insulating layers 12 and 14 may be made from prepregs with resin of higher fluidity therein at a temperature range to be required in molding. In this case, the part 4 can be absolutely surrounded by the insulating layers 12 and 14. The thickness of the flexible insulating layer 15 may be preferably set within a range of 20 to 60 µm. Too thin thickness may deteriorate the insulating property and the mechanical strength of the insulating layer 15. Too thick thickness may deteriorate the flexibility of the insulating layer 15. As shown in FIG. 4, the insulating layer 11 and 13 may be constituted as multilayered insulating layers, respectively from the corresponding prepregs.

As described above, the insulating layer 12 is formed between the insulating layers 11 and 13 so as to embed the space (containing the roll off 13a of the insulating layer 13) around the part 4. Therefore, the shape of the insulating layer 12 around the part 4 becomes complicated commensurate with the outer shape of the part 4. The insulating layer 12 can embed the space around the part 4 by the melted resin of the corresponding prepreg at the formation of the insulating layer 12. In this case, the insulating layer 12 embeds the spaces of the wiring layers 21 and 22.

In this point of view, the shape of the insulating layer 12 may be changed in accordance with the sizes, shapes and positions of the part 4 and the wiring layers 21, 22. In this embodiment, the insulating layer 12 is formed so as to cover the top surface of the part 4 and/or the bottom surface of the part 4 (refer to FIG. 2), but may be formed as occasion demands. As shown in FIG. 3, the insulating layer 12 may be formed so as to cover the connection 51. In this case, the part 4 is surrounded by the insulating layers 12 and 14 so as to be embedded between the rigid insulating layer 11 and the flexible wiring board 2.

In FIG. 3, the insulating layer 14 is infiltrated into the roll off 13a so as to cover the top surface of the part 4. In other words, the part 4 is surrounded and sealed by the insulating layers 12 and 14. As a result, the part 4 is absolutely embedded into and protected by the rigid insulating layers.

According to the multilayered printed wiring board 100 shown in FIG. 3, the total thickness of the board 100 can be reduced in comparison with the thickness of the part 4. In FIG. 3, the rigid wiring board 3 is removed, but may be provided at the right edge thereof in the same manner as the board 100 in FIGS. 1 and 2.

In FIG. 4, since the insulating layer 13 is constituted as the multilayered structure using the corresponding prepregs, the part 4 can be embedded in the insulating layer 13 even though the thickness of the part 4 is large. In this case, since the thickness of each prepreg can be set to a normal thickness range, the interlayer connection can be absolutely formed through the corresponding prepregs by means of conductive bump. Moreover, since the number of wiring layer can be increased commensurate with the number of constituent insulating layer, the wiring can be freely designed so that the planer size of the multilayered printed wiring board 100 can be reduced.

In FIG. 4, the number of constituent insulating layer of the insulating layer 11 is set equal to the number of constituent insulating layer of the insulating layer 13, but may be different one another. In FIG. 4, the number of constituent insulating layer is set to three for the insulating layers 11 and 13. The insulating layer 11 may be made of a single layered structure, and the insulating layer 13 may be made of a three-layered structure. It is not required that the total thickness of the prepregs of the insulating layer 11 is set equal to the total thickness of the prepregs of the insulating layer 13. If the total thickness of the prepregs is set equal to one another, the warpage of the multilayered printed wiring board 100 can be prevented effectively after the formation by means of pressing.

In the case that the insulating layers 12 and 14 are constituted as the multilayered structure, the insulating layers 12 and 14 may be structured as shown in FIG. 2 or 4. In FIG. 2, the top surface of the part 4 is covered with the insulating layer 12. In other words, the insulating layers 12 and 14 may be formed as designed only if the part 4 is surrounded by the insulating layers 12 and 14 and the connection 51 is protected by the insulating layer 12. In fact, the part 4 is surrounded by the resins of the prepregs of the insulating layers 12 and 14.

The interlayer connection conductors 31 to 35 are originated from the conductive bumps formed by means of screen printing of conductive composition paste (often called as "conductive paste"). Therefore, the diameter of each interlayer connection conductor is changed along the axial direction thereof (the thickness direction of the board 100). The conductive paste may be made, e.g., by dispersing conductive metallic powders of Ag, Au or Cu into the resin paste. In the use of the conductive paste, the aspect ratio of the conductive bump can be increased by means of screen printing using a metallic mask with a larger thickness. The diameter and height of the conductive bump may be determined in view of the wiring distance and the thickness of the prepreg.

The interlayer connection conductor 32 is disposed between the wiring layers 22 and 23 so as to electrically connect the wiring layers 22 and 23 through the insulating layer 12. The diameter of the interlayer connection conductor 32 is increased from the top in the side of the wiring layer 22 to the bottom in the side of the wiring layer 23 because the conductive bump to be the interlayer connection conductor 32 is formed on the lands of the wiring layer 23 (see, FIGS. 2 to 4).

In this case, the interlayer connection conductor 32 can be formed effectively and efficiently because the simultaneous screen printing of the solder cream for the packaging of the part 4 and the conductive past on the same surface of the wiring layer 22 requires a complicated screen printing machine so that the manufacturing cost is increased.

The interlayer connection conductor 34 is disposed between the wiring layers 24 and 25 so as to electrically connect the wiring layers 24 and 25 through the insulating layer 14. The diameter of the interlayer connection conductor 34 is increased from the top in the side of the wiring layer 24 to the bottom in the side of the wiring layer 25 because the conductive bump to be the interlayer connection conductor 34 is formed on the lands of the wiring layer 25 (see, FIGS. 2 to 4). In this case, since the forefront of the conductive bump to be the interlayer connection conductor 34 is pressed against the rigid insulating layer 13, the interlayer connection conductor 34 can be connected with the wiring layer 24 without fail.

The interlayer connection conductors 31, 33 and 35, which are formed through the insulating layer 11 (first rigid board), the insulating layer 13 (second rigid board) and the insulating layer 15 (flexible board), may be configured as occasion demands. It is desired, however, to decrease the diameter of each interlayer connection conductor in the side for a smaller wiring pattern to be formed. In this point of view, the diameter of each interlayer connection conductor is decreased along the axial direction from the bottom to the top of the multilayered printed wiring board 100. The interlayer connection conductor 31 to electrically connect the wiring layers 21 and 22 which are formed on both main surfaces of the insulating layer 11 may be made of a conductive film formed in a through-hole, not from a conductive bump. The interlayer connection conductors 33 and 35 may be formed in the same manner as the interlayer connection conductor 31. The interlayer connection conductor 33 electrically connects the wiring layers 23 and 24 formed on both main surfaces of the insulating layer 13. The interlayer connection conductor 35 electrically connects the wiring layers 25 and 26 formed on both main surfaces of the insulating layer 15.

in this embodiment, since the part 4 such as the 0402 chip is embedded into the multilayered printed wiring board 100, the multilayered printed wiring board 100 can be downsized without the decrease of the number of part. Then, since the multilayered printed wiring board 100 includes the rigid wiring board 1, the multilayered printed wiring board 100 can maintain the desired hardness. Then, since the multilayered printed wiring board 100 partially includes only the flexible wiring board 2, the multilayered printed wiring board 100 can maintain the desired flexibility. In this embodiment, since the part 4 is embedded in the rigid wiring board 1, the part 4 can be protected against external mechanical shock.

In this embodiment, the multilayered printed wiring board 100 is configured such that some parts can be mounted on the flexible wiring board 2 (the bottom surface) in addition to on the rigid wiring board 1 (the top surface).

In this point of view, if the multilayered printed wiring board 100 is configured as a normal size, many parts can be contained for the multilayered printed wiring board 100 because one or more parts can be embedded in the multilayered printed wiring board 100 (insulating layers) and one or more parts can be mounted on both surfaces of the multilayered printed wiring board 100. If the number of part is set to a conventional one, the multilayered printed wiring board 100 can be downsized in comparison with a conventional one.

Therefore, the multilayered printed wiring board 100 may be employed as a module board to be used for a sensor module or a camera module. Since the module board is built in a portable device, the module board is required to be downsized, thinned, grown in density and also, flexible enough to be bended and housed at the fabrication of the portable device.

(Manufacturing Method)

Some embodiments related to the manufacturing method of the multilayered printed wiring board will be described with reference to FIGS. 5 to 16. As described previously, like or corresponding components are designated by the same reference numerals throughout the drawings.

Figure 5:
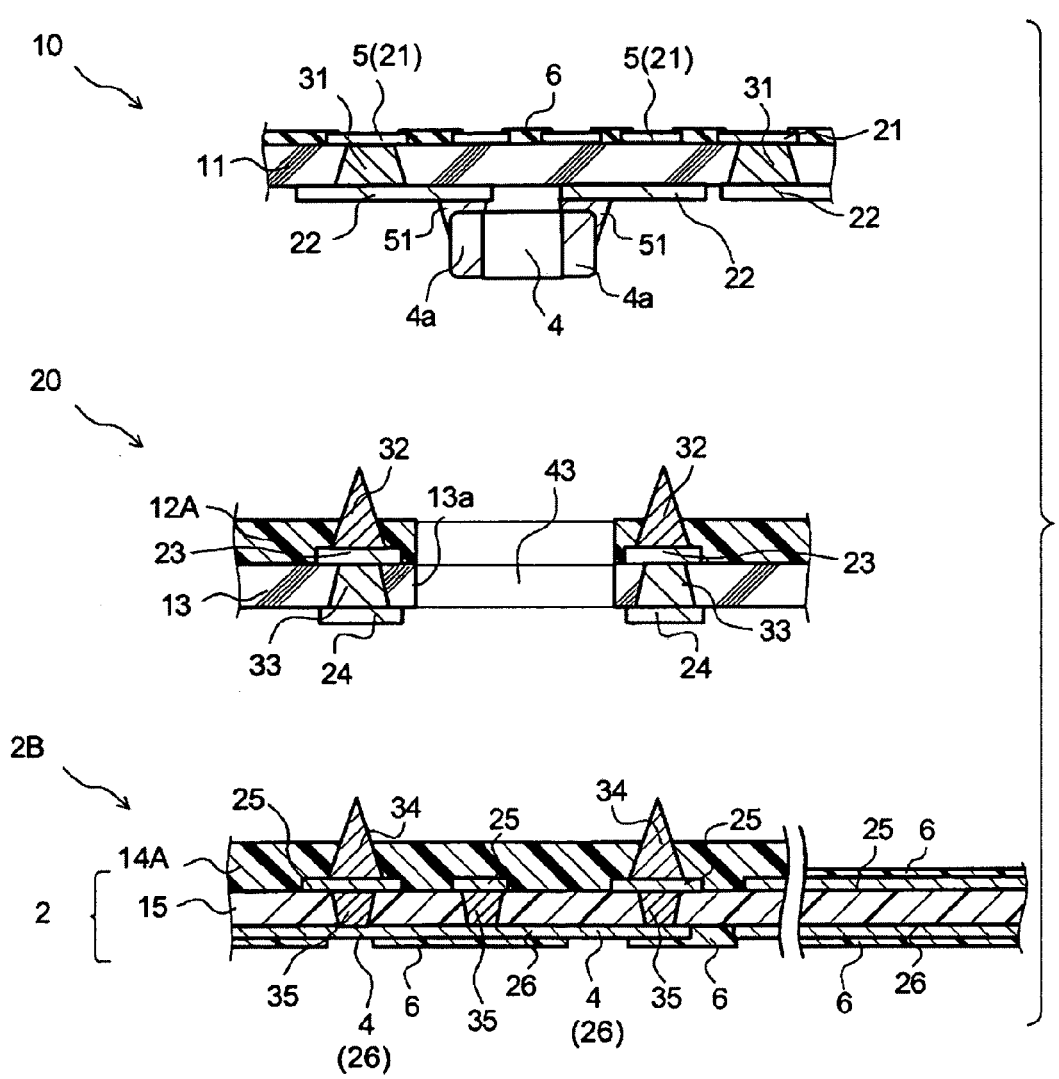
FIG. 5 relates to cross sectional views schematically showing some steps in a manufacturing method for the multilayered printed wiring board in FIG. 2.

As shown in FIG. 5, first of all, the first rigid wiring board structure 10 is prepared. The part 4 is embedded in the structure 10. Then, the second rigid wiring board structure 20 is prepared. The roll off 43 is formed at the second rigid wiring board structure 20 and the interlayer connection conductor 32 is formed through the prepreg 12A. Then, the flexible wiring board structure 2B is prepared. The structure 2B contains the flexible wiring board 2 and the interlayer connection conductor 32 through the prepreg 12A. The first rigid wiring board structure 10, the second rigid wiring board structure 20 and the flexible wiring board structure 2B are positioned and pressed one another. Then, the formation process of each structure will be described hereinafter.

(Formation of Rigid Wiring Board Structure)
(Preparation of Rigid Board for Part to be Embedded)

Figure 6:
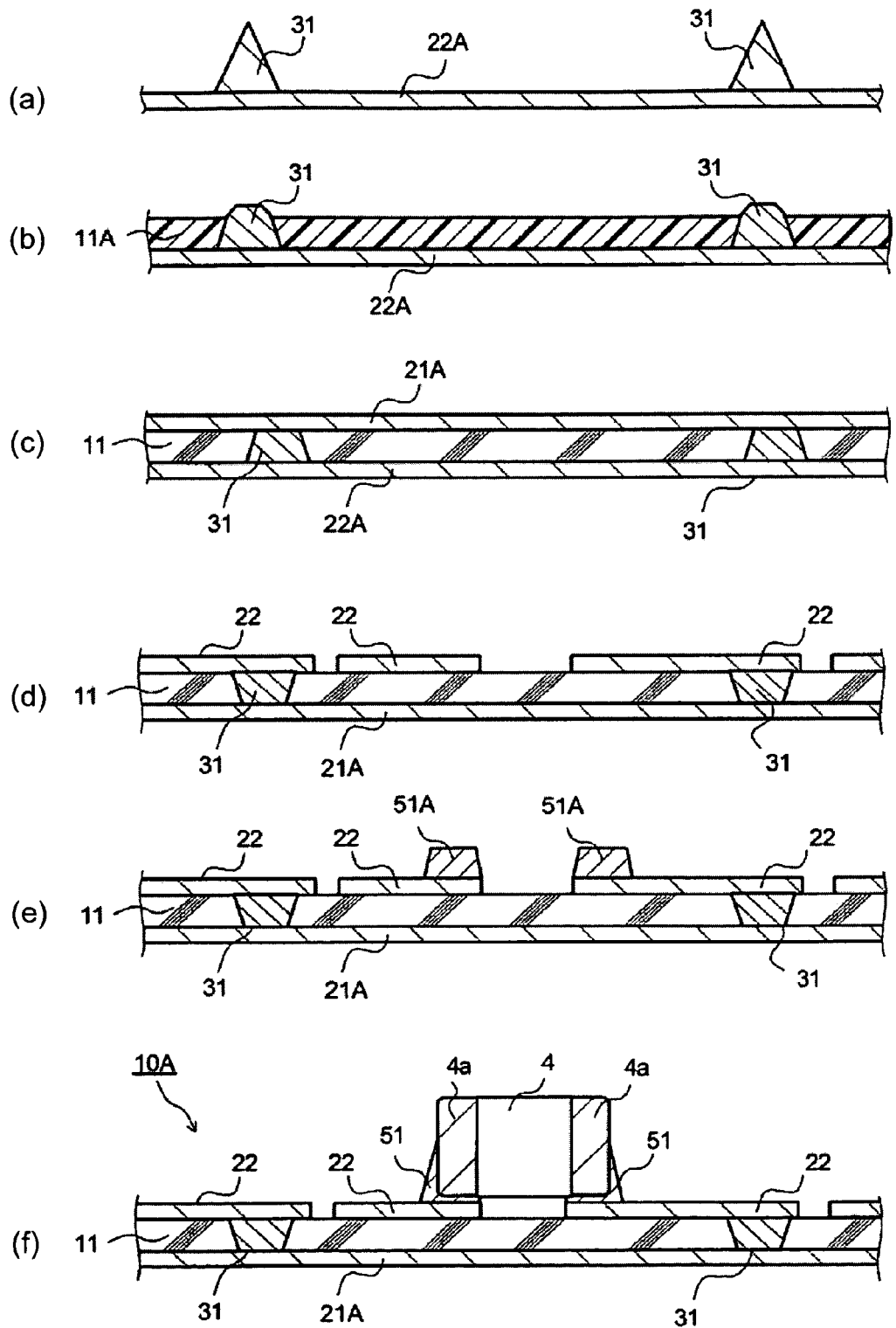
FIG. 6 relates to cross sectional views schematically showing some steps in a manufacturing method for the rigid wiring board of the multilayered printed wiring board in FIG. 2.

FIG. 6 relates to cross sectional views schematically showing some steps for forming the rigid wiring board structure 10. First of all, as shown in FIG. 6(a), the conical conductive bumps are formed by means of screen printing using conductive paste on the conductive foil (electrolytic copper foil) 22A. The conductive bumps are converted into the interlayer connection conductors 31. The bottom diameter of the conductive bump may be set to 200 μm and the height of the conductive bump may be set to 160 μm. The conductive bumps are dried and hardened so as to be converted into the interlayer connection conductors 31.

Then, as shown in FIG. 6(b), the prepreg 11A is formed on the same surface of the conductive foil 22A and pressed so that the forefronts of the interlayer connection conductors 31 are exposed through the prepreg 11A. The forefronts of the interlayer connection conductors 31 may be pressed and flattened during or after the formation of the interlayer connection conductors 31. The diameter of the interlayer connection conductor 31 is changed along the axial direction. Then, as shown in FIG. 6(c), the conductive foil (electrolytic copper foil) 21A is formed on the prepreg 11A and pressed against the prepreg 11A. In this case, the conductive foil 21A is electrically connected with the interlayer connection conductors 31 and the prepreg 11A is hardened to be the insulating layer 11. The interlayer connection conductors 31 are formed in conical trapezoidal shape because the forefronts of the interlayer conductors 31 are flattened.

Then, as shown in FIG. 6(d), the conductive foil 22A is patterned by means of photolithography so as to form the wiring pattern 22 containing the lands for packaging and for connection. The packaging lands are used for mounting the part 4 and the connection lands are used for connecting the forefronts of the interlayer connection conductors 32 as shown in FIGS. 2 and 3. As shown in FIG. 6(e), the solder cream 51A is printed on the packaging land by means of screen printing. The solder cream 51A can be easily printed by means of screen printing. Instead of the screen printing technique, a dispenser may be employed. Instead of the solder cream 51A, a conductive resin may be employed.

Figure 8:
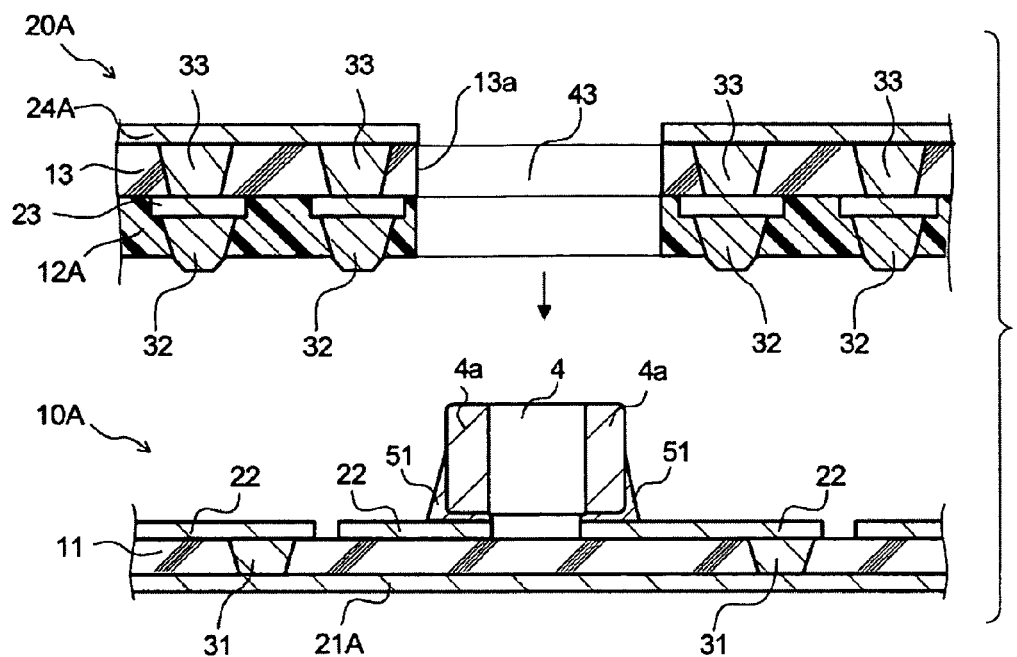
FIG. 8 relates to cross sectional views schematically showing some still other steps in a manufacturing method for the rigid wiring board of the multilayered printed wiring board in FIG. 2.

Then, the part 4 is mounted on the packaging lands via the solder cream 51A by means of mounter. The solder cream 51A is reflowed in a reflow furnace. As a result, as shown in FIG. 6(f), the part 4 can be mounted on the packaging lands of the wiring layer 22 via the connection 51, thereby completing the wiring board structure 10A. The wiring board structure 10A will be employed in the subsequent process as shown in FIG. 8.

(Preparation of Rigid Board Containing Space to Embed Part)

FIG. 7A relates to cross sectional views schematically showing some steps for forming the rigid board containing the space to embed the part. First of all, as shown in FIG. 7A(a), the conductive foils (electrolytic copper foils) 23A and 24A are formed in a given thickness on both main surfaces of the rigid insulating layer 13 so as to be electrically connected with one another via the interlayer connection conductor 33 formed through the insulating layer 13. As a result, the rigid board with the conductive foils formed on both main surfaces thereof can be formed. The process in FIG. 7A(a) is similar to the process in FIGS. 6(a) to (c).

Then, as shown in FIG. 7A(b), the conductive foil 23A (to be opposite to the insulating layer 11) is patterned by means of photolithography to form the wiring layer (wiring pattern) 23 containing the lands for connection. The connection lands are employed for forming the interlayer connection conductors 32 as shown in FIGS. 2 and 3. In this case, the bottoms of the interlayer connection conductors 32 with a larger diameter are positioned on the lands.

Then, the conductive bumps are formed in conical shape (e.g., the bottom diameter: 200 μm, the height: 160 μm) on the connection lands 23 by means of screen printing using the conductive paste. The conductive bumps are dried and hardened to be converted into the interlayer connection conductor 32.

Then, as shown in FIG. 7A(d), the prepreg 12A under semi-hardened condition is formed on the wiring layer 23 by means of pressing machine. In this case, the forefronts of the interlayer connection conductors 32 are exposed from the prepreg 12A. The forefronts of the interlayer connection conductors 32 may be flattened during or after the formation of the interlayer connection conductors 32. The interlayer connection conductors 32 are configured such that each diameter is changed along the axial direction. In this case, the wiring layer 23 is embedded by the prepreg 12A.

Then as shown in FIG. 7A(e), the roll off 13a is formed for disposing the part 4 therein. The roll off 13a may be formed as a through-hole 43 at the laminated structure as shown in FIG. 7(d). The roll off 13a may be formed by means of normal processing means such as drilling, router processing, punching processing or laser processing. The size of the roll off 13a may be determined commensurate with the size of the part 4. In the processing of the roll off 13a, it is desired not to create powder dust in view of the subsequent embedding of the part 4. It is desired, therefore, to remove the powder dust by means of dust roller, air blow machine or dust collector after the through-hole 43, that is, the roll off 13a is formed. If a protective layer is formed on the prepreg 12A so as to cover the forefronts of the interlayer connection conductors 32, the powder dust is unlikely to be directly attached to the forefronts of the interlayer connection conductors 32 and the prepreg 12A. In this way, the wiring board structure 20A can be formed.

As shown in FIG. 6, the part 4 can be mounted on any lands within the allowable range of the wiring layer 22. As shown in FIG. 7, in contrast, the roll off 13a is necessarily formed in view of the size, the shape and the position of the part 4.

FIG. 7B relates to cross sectional views schematically showing some other steps for forming the rigid board containing the space to embed the part. The steps shown in FIG. 7B correspond to the steps modified from the ones in FIG. 7A. The steps shown in FIGS. 7B(a) and (b) are similar to the steps shown in FIGS. 7A(a) and (b). Therefore, the interlayer connection conductors 33 are formed through the insulating layer 13, and the conductive foil 24A is formed on the rear surface of the insulating layer 13, and the patterned wiring layer 23 is formed on the main surface of the insulating layer 13. Then, the roll off 13a is formed as the through-hole 43 through the wiring layer 23, the insulating layer 13 and the conductive foil 24A. Then, as shown in FIG. 7B(d), the conical conductive bumps are formed by means of screen printing using the conductive paste. In this case, since the through-hole 43 (roll off 13a) is formed in advance, the insulating layer 13 may be warped by the screen printing. In this point of view, it is desired that the roll off 13a is embedded with the jig 61. Herein, it is required that the jig 61 is not projected from the insulating layer 13 and the conductive foil 24A so as to maintain flat the main surfaces of the laminated structure shown in FIG. 7B(d).

Then, as shown in FIG. 7B(e), the jig 61 for the screen printing is removed, and the prepreg 12A under semi-hardened condition (B-stage) is formed on the insulating layer 13 so as to cover the wiring layer 23 so that the position of the roll off 13a (through-hole 43) of the prepreg 12A can be matched with the roll off 13a (through-hole 43) of the laminated structure. As a result, the wiring board structure 20A can be formed. According to the steps shown in FIG. 7B, since the interlayer connection conductors 32 are formed after the through-hole 43 is formed, the powder dust created at the formation of the through-hole 43 can be removed before the interlayer connection conductors 32 are formed. In this case, the interlayer connection conductors 32 can be formed under no powder dust condition.

The interlayer connection conductors 33 may be made of the conductive films formed on the inner walls of the through-holes or the conductive composition materials filled in the through-holes. For example, if the thickness of the insulting layer 13 is increased, the sizes of the interlayer connection conductors, particularly, the heights and diameters of the bottom surfaces of the interlayer connection conductors may be also increased. Therefore, the formation of the interlayer connection conductors may disturb the miniaturization of the wiring layer(s), that is, the intended multilayered printed wiring board 100. In this point of view, when the insulating layer is formed thick, the interlayer connection conductors are preferably made of the conductive films or the conductive composition materials which are formed in the through-hole through the insulating layer. In this case, the diameter of the interlayer connection conductor becomes uniform along the axial direction. Herein, the interlayer connection conductors may be formed in any shape only if the interlayer connection, conductors can electrically connect the adjacent wiring layers.

(Rigid Wiring Board: Combination Through Laminating)

FIG. 8 shows the arrangement between the wiring board structure 10A and the wiring board structure 20A. The wiring board structure 10A is laminated onto the wiring board structure 20A and pressed under heating condition so that the part 4 can be inserted into the roll off 13a (through-hole 43) and the forefronts of the interlayer connection conductors 32 can be electrically contacted with the lands of the wiring layer 22. The pressing may be carried out for both sides of the thus laminated structure. In this case, the prepreg 12A is perfectly hardened so that the wiring board structure 10A is combined with the wiring board structure 20A via the prepreg 12A.

In this case, since the prepreg 12A is rendered fluid through the heating, the prepreg 12A is partially infiltrated around the part 4 so that the part 4 can be sealed with the resin of the prepreg 12A. In this case, the connection 51 is also covered with the resin of the prepreg 12A. Since the part 4 is sealed with the resin of the prepreg 12A, the part 4 is also fixed with the resin of the prepreg 12A. Therefore, the part 4 can be electrically connected with the lands of the wiring layer 22 without fail. In the case that the part 4 is mounted on the board, since the part 4 is very small so that the connection between the part 4 and the electrode terminals is also very small, the part 4 is likely to be dropped out of the electrode terminals due to the soldering reflow. In contrast, in this embodiment, the part 4 can be fixed in the board with the resin of the prepreg without fail so that the reliability of the part 4 can be improved.

Figure 9:
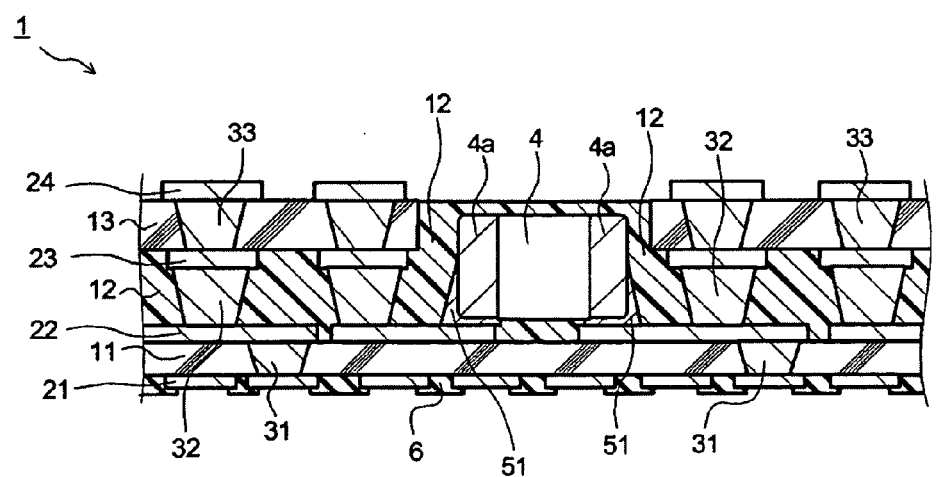
FIG. 9 is a cross sectional view schematically showing a rigid wiring board of the multilayered printed wiring board in FIG. 2.

Then, as shown in FIG. 9, the conductive foils 21A and 24A are patterned by means of photolithography to form the wiring layers 21 and 24. The wiring layer 24 includes the lands for connecting the forefronts of the interlayer connection conductors 34 shown in FIG. 2. Then, the protective layer 6, e.g., made of solder resist, is formed on the wiring layer 21 so as to expose the portions of the wiring layer 21 to be used as external terminals. No protective layer is formed on the wiring layer 24 to which the flexible wiring board is to be formed. In this way, the intended rigid wiring board 1 containing the part 4 therein can be formed as shown in FIG. 9.

Figure 10:
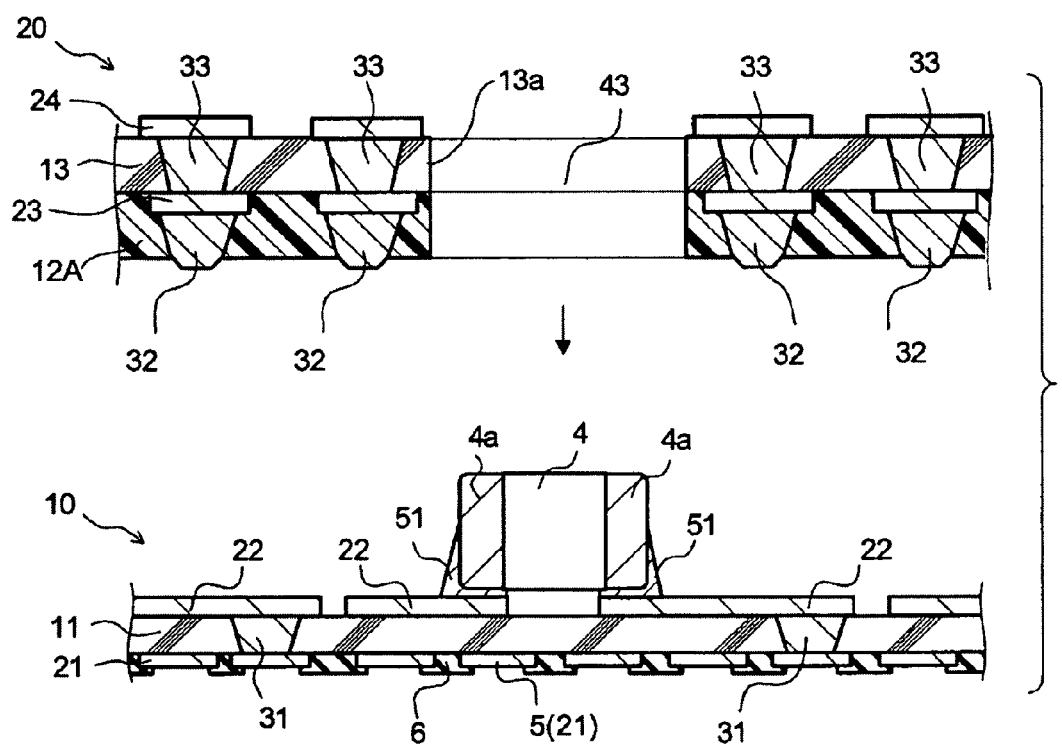
FIG. 10 relates to cross sectional views schematically showing some other steps in a manufacturing method for the multilayered printed wiring board.

In FIGS. 6 to 8, the patterning process of the wiring layers 21 and 24 and the forming process of the protective layer 6 are carried out after the wiring board structures 10A and 20A are laminated and combined one another via the prepreg 12A. As shown in FIG. 10, however, the patterning process of the wiring layers 21 and 24 and the forming process of the protective layer 6 are carried out before the wiring board structures 10A and 20A are laminated and combined one another via the prepreg 12A. Both processes relating to FIGS. 6 to 8 and FIG. 10 may be employed only if the wiring layers 21 and 24 are patterned before the flexible wiring board is laminated via the wiring layers 21 and 24. Some portions of the patterned wiring layer 24 function as the lands for electrically connecting the interlayer connection conductors 34.

In the embodiment relating to FIG. 10, the patterning process of the wiring layer 24 is not required after the part 4 is inserted into the roll off 13a so that the part 4 may be projected from the insulating layer 12 or uncovered with the resin of the prepreg 12A.

(Preparation of Flexible Wiring Board)

Figure 11:
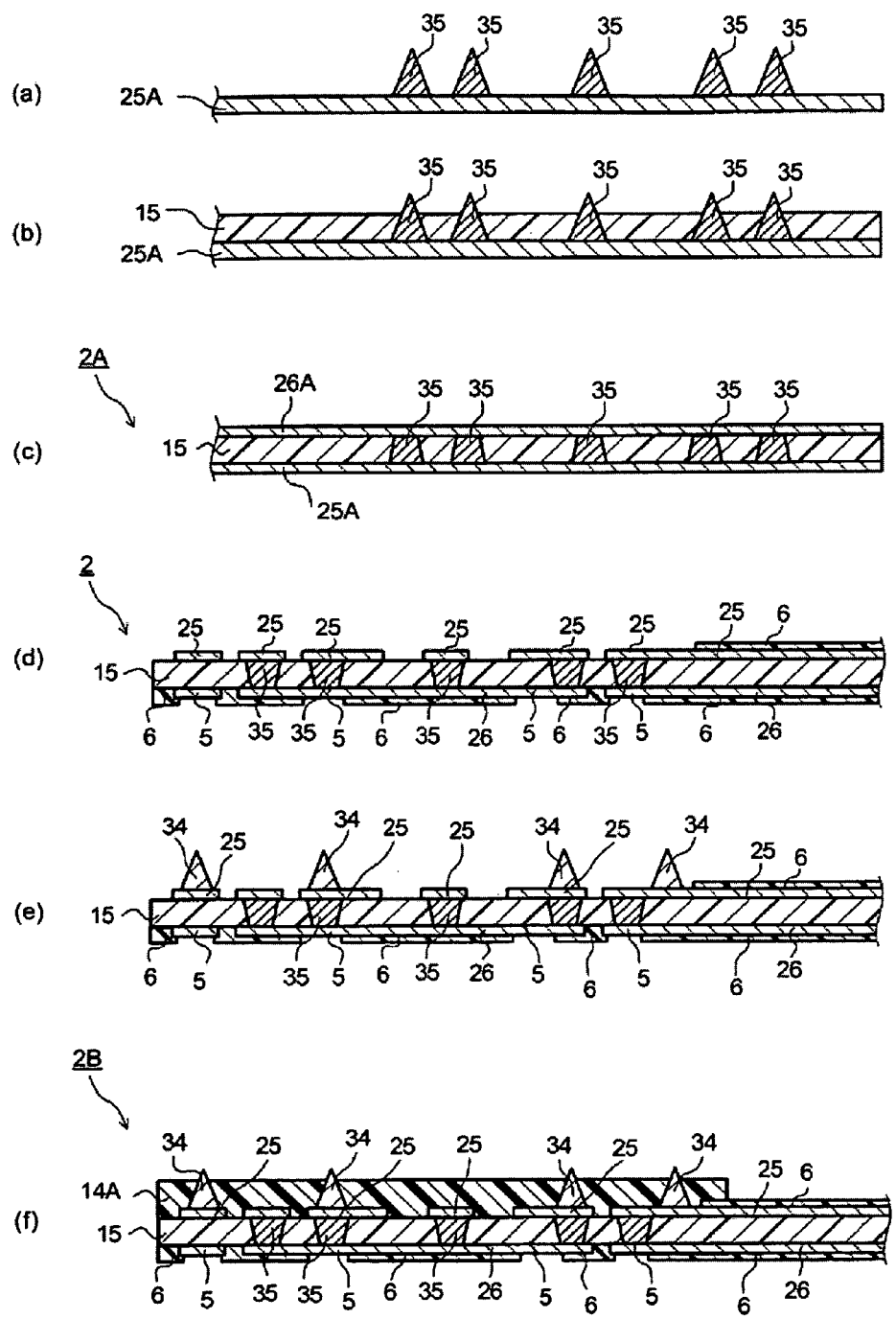
FIG. 11 relates to cross sectional views schematically showing some steps in a manufacturing method for the flexible wiring board of the multilayered printed wiring board in FIG. 2.

Then, the manufacturing process of the flexible wiring board 2 to be laminated on the rigid wiring board 1 will be described with reference to FIG. 11.

First of all, as shown in FIG. 11(a), the conical conductive bumps are formed by means of screen printing using conductive paste on the conductive foil (electrolytic copper foil) 25A. The conductive bumps are converted into the interlayer connection conductors 35. The bottom diameter of the conductive bump may be set to 200 μm and the height of the conductive bump may be set to 160 μm. The conductive bumps are dried and hardened so as to be converted into the interlayer connection conductors 35.

Then, as shown in FIG. 11(b), the prepreg 15A under semi-hardened condition (B stage) is formed on the same surface of the conductive foil 25A and pressed so that the forefronts of the interlayer connection conductors 35 are exposed through the prepreg 15A. The forefronts of the interlayer connection conductors 35 may be pressed and flattened during or after the formation of the interlayer connection conductors 35. Then, as shown in FIG. 11(c), the conductive foil (electrolytic copper foil) 26A. e.g., with a thickness of about 18 μm is formed on the prepreg 15A and pressed against the prepreg 15A. In this case, the conductive foil 26A is electrically connected with the interlayer connection conductors 35 and the prepreg 15A is hardened to be the flexible insulating layer 15. The interlayer connection conductors 35 are formed in conical trapezoidal shape because the forefronts of the interlayer connection conductors 35 are flattened. The diameters of the interlayer connection conductors 35 are changed along the axial direction and the stacking direction of the foils and the prepregs.

Then, as shown in FIG. 11(d), the conductive foils 25A and 26A are patterned by means of photolithography so as to form the wiring patterns 25 and 26. The wiring pattern 25 is located inside in the multilayered printed wiring board 100 so as to contain the lands for connection. The connection lands of the wiring pattern 25 are formed so as to correspond to the connection lands of the bottom wiring layer 24 of the rigid wiring board 1. The wiring pattern 26 contains the terminals 5 for packaging. Then, the protective layer 6, e.g., made of solder resist, is formed on the wiring patterns 25 and 26 except the connection lands and the external terminals. In this way, the two-sided flexible wiring board 2 is formed.

Then, as shown in FIG. 11(e), the conductive bumps 34A to be the interlayer connection conductors 34 are formed in conical shape (e.g., the bottom diameter: 200 μm, the height: 160 μm) on the connection lands of the wiring layer 25 by means of screen printing using the conductive paste. The conductive bumps 34A are dried and hardened to be converted into the interlayer connection conductors 34.

Then, as shown in FIG. 11(f), the prepreg 14A under semi-hardened condition is formed on the wiring layer 25 by means of pressing machine. Not shown, the prepreg 14A is also formed on the side of the wiring layer 25 on which the rigid wiring board 3 is laminated. The through-hole 43 to house the part 4 may be formed for the prepreg 14A in advance in the same manner as the insulating layer 13 (refer to FIG. 13). In this case, the part 4 can not be stressed by the glass cloth or the like contained in the prepreg 14A even though the distance between the top surface of the part 4 to be embedded and the wiring layer 25 of the flexible wiring board 2 is decreased.

In this case, the forefronts of the interlayer connection conductors 34 are exposed from the prepreg 14A. The forefronts of the interlayer connection conductors 34 may be flattened during or after the formation of the interlayer connection conductors 34. The interlayer connection conductors 34 are configured such that each diameter is changed along the axial direction. In this case, the wiring layer 25 is embedded by the prepreg 14A.

The two-sided flexible wiring board with the interlayer connection conductors through the insulating layer and the prepreg is called as the wiring board structure 2B for convenience. Herein, the two-sided flexible wiring board may be formed by another manufacturing process. Moreover, the flexible wiring board may be configured as another structured wiring board. For example, the flexible wiring board may be made of polyimide or by means of interlayer connection using the through-hole. In this case, the steps shown in FIG. 11(e) and (f), that is, the formation of the prepreg 14A and the formation of the conductive bumps through the prepreg 14A are required.

(Combination of Rigid Wiring Board and Flexible Wiring Board)

Figure 12:
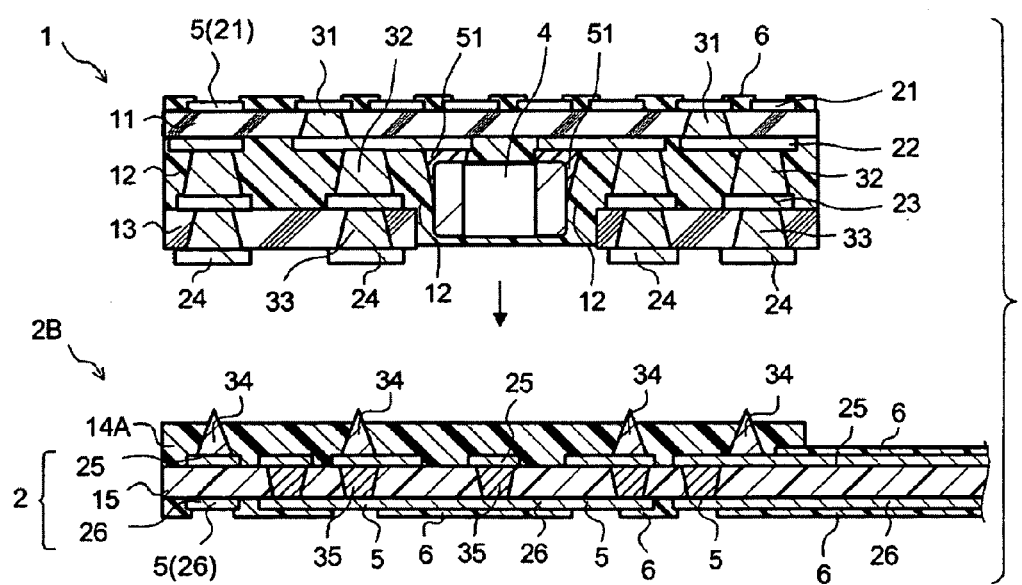
FIG. 12 relates to cross sectional views schematically showing some steps in a manufacturing method for the multilayered printed wiring board in FIG. 2.
Figure 13:
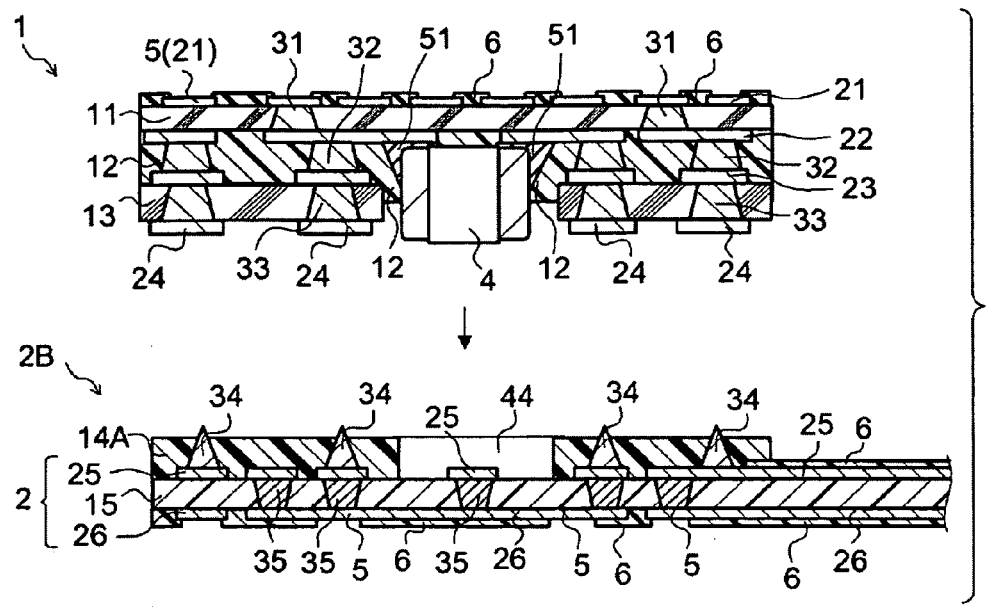
FIG. 13 relates to cross sectional views schematically showing some steps in a manufacturing method for the multilayered printed wiring board in FIG. 3.

As shown in FIG. 12, the rigid wiring board 1 obtained in FIG. 9 is laminated onto and pressed against the wiring board structure 2B under heating condition so that the forefront of the interlayer connection conductors 34 can be opposite to the connection lands of the wiring layer 24. In the wiring board structure 2B, as described above, the forefronts of the interlayer connection conductors 34 are exposed from the prepreg 14A. The pressing may be carried out for both sides of the thus laminated structure. In this case, the prepreg 14A is perfectly hardened so that the rigid wiring board 1 is combined with the wiring board structure 2B via the prepreg 14A.

In this case, the forefronts of the interlayer connection conductors 34 are plastically deformed and flattened against the connection lands of the wiring layer 24 of the rigid wiring board 1 so that the wiring layer 24 can be electrically connected with the interlayer connection conductor 34. The interlayer connection conductors 34 are formed in conical trapezoidal shape so that each diameter can be changed along the axial direction. In this embodiment, the diameter of each interlayer connection conductor 34 is increased from the side of the wiring layer 24 to the side of the wiring layer 25. In this way, the intended multilayered printed wiring board 100 can be obtained as shown in FIGS. 1 and 2.

Figure 14:
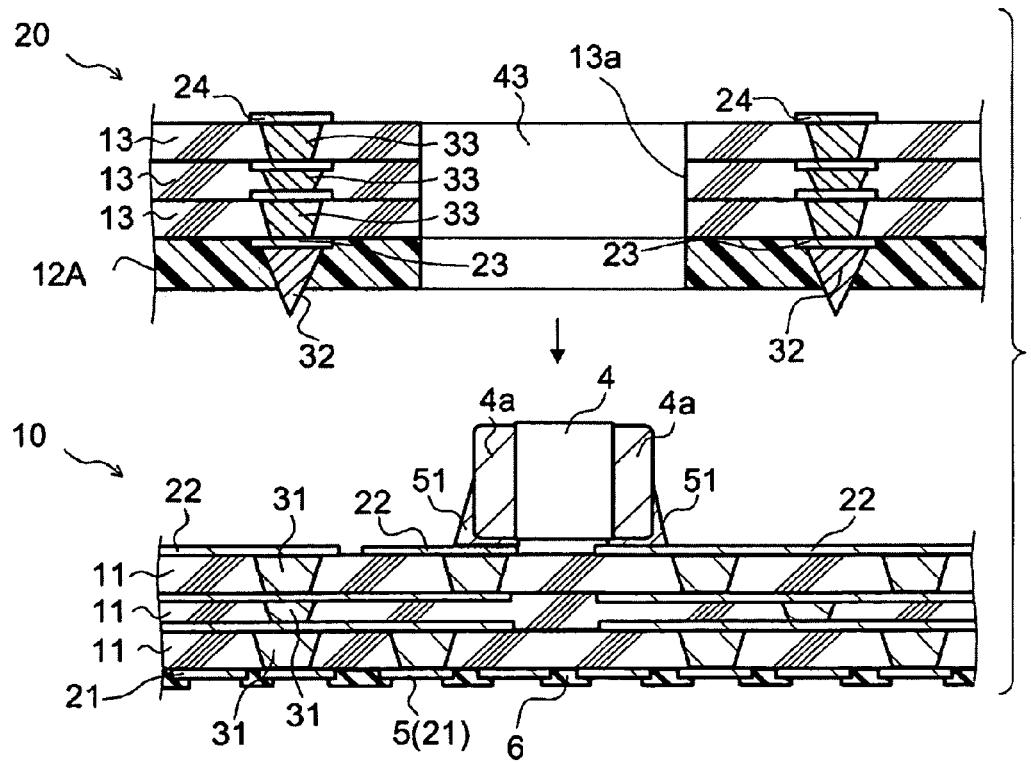
FIG. 14 relates to a cross sectional view schematically showing a step in a manufacturing method for the multilayered printed wiring board in FIG. 4.
Figure 15:
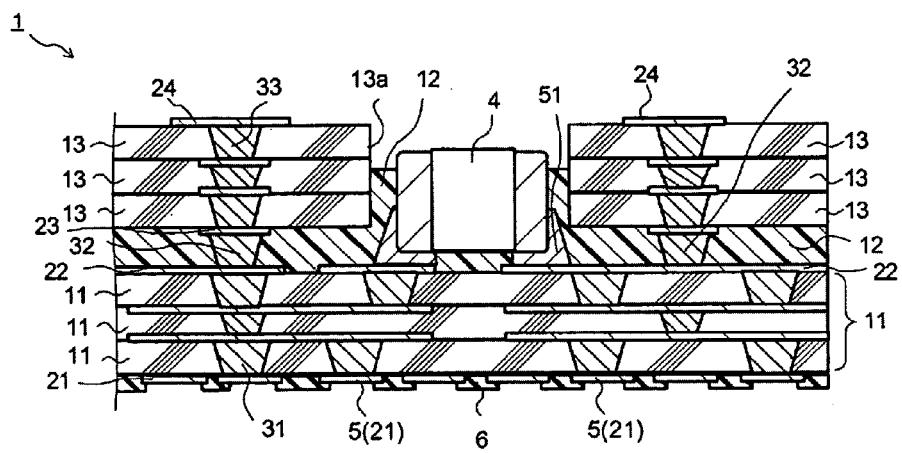
FIG. 15 relates to a cross sectional view schematically showing another step in a manufacturing method for the multilayered printed wiring board in FIG. 4.
Figure 16:
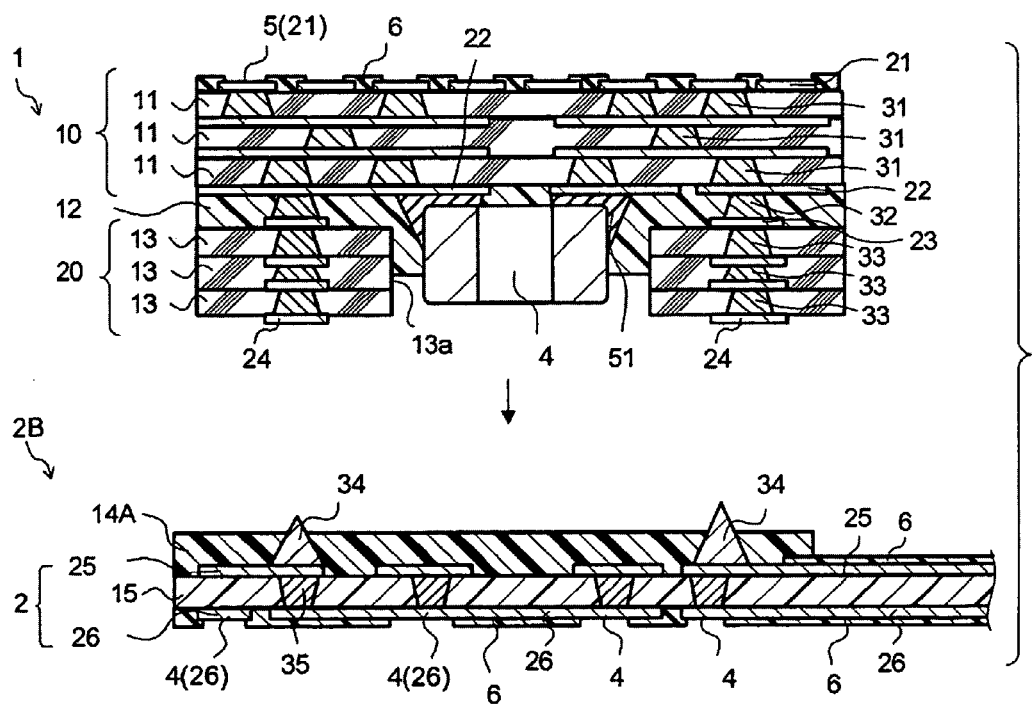
FIG. 16 relates to a cross sectional view schematically showing still another step in a manufacturing method for the multilayered printed wiring board in FIG. 4.

FIGS. 14 to 16 relate to cross sectional views schematically showing some steps in a manufacturing method for the multilayered printed wiring board in FIG. 4.

As shown in FIG. 14, the first rigid board and the second rigid board are prepared, respectively. The first rigid board is configured as a four-layered wiring board containing rigid three insulating layers and as mounting the part. The second rigid board is also configured as a four-layered wiring board containing rigid three insulating layers and as providing a space for the part to be embedded. The first rigid board and the second rigid board can be formed in the same manner as shown in FIGS. 6 to 9.

Then, as shown in FIG. 14, the part 4 is mounted on the lands of the wiring layer 22 and the electrode terminals 4a are electrically connected with the wiring layer 22 via the connection 51, thereby forming the first rigid wiring board structure 10 in the same manner as shown in FIGS. 6(d) and (f). Then, the conductive bumps as the interlayer connection conductors 32 are formed on the wiring layer 23 formed on the main surface of the insulating layer 13, and the prepreg 12A under semi-hardened condition is formed on the same surface so that the forefronts of the interlayer connection conductors 32 are exposed from the prepreg 12A. Then, the through-hole 43 is formed at the thus obtained laminated structure so as for the part 4 to be embedded. In this way, the second rigid wiring board structure 20 can be formed (refer to FIGS. 7A and 7B). The forefronts of the interlayer connection conductors 32 may be flattened during or after the exposure of the forefronts thereof from the prepreg 12A.

Then, the first rigid wiring board structure 10 is positioned for and pressed under the heating condition against the second rigid wiring board structure 20. The pressing may be carried out by means of pressing machine. In this case, the first rigid wiring board structure 10 is combined with the second rigid wiring board structure 20, thereby forming the rigid wiring board 1 as shown in FIG. 15. The interlayer connection conductors 32 are configured such that the diameter of each interlayer connection conductor is changed along the axial direction. In FIG. 15, the diameter of each interlayer connection conductor is increased from the side of the wiring layer 22 to the side of the wiring layer 23. Then, as shown in FIG. 16, the rigid wiring board 1 is positioned for and pressed against the flexible wiring board 2, thereby forming the multilayered printed wiring board 100 as shown in FIG. 4.

As described above, according to the manufacturing methods of these embodiments, one rigid board with the part to be embedded is laminated onto and pressed against the other rigid board. In this case, since the roll off is formed at the other rigid board commensurate with the part, the part can be inserted into the roll off at the laminating and the pressing. In this way, the intended rigid wiring board is formed and pressed against the flexible wiring board, thereby forming the multilayered printed wiring board which can exhibit the hardness and the flexibility and contain the part therein.

Since the part is mounted on the main surface of the rigid board, the mounting operation of the part can be easily carried out by means of a normal mounter. Then, since the rigid board is laminated onto the additional rigid board so that the part can be inserted into the roll off of the additional rigid board, the part can not be stressed by the additional rigid board. Also, since the prepreg is employed, the part can be sealed with the resin of the prepreg without an additional sealing member. Since the part can be embedded at the laminating and pressing, the manufacturing process of the multilayered printed wiring board can be simplified.

In these embodiments, since the interlayer connection conductors are made from the conductive bumps, the multilayered printed wiring board can be grown in density and the manufacturing process can be simplified. Since the part is mounted on the lands of the wiring layer, the electrical connection of the part can be checked before the packaging (embedding). In this point of view, the yield ratio of the multilayered printed wiring board can be developed so that the manufacturing process of the multilayered printed wiring board can be simplified. The rigid board and the flexible board can be made from normal materials, respectively so that the manufacturing cost of the multilayered printed wiring board can be reduced.

Since the part 4 is inserted into the roll off 13a formed by partially removing the prepregs to be the insulating layers 12 and 13, the part 4 can not be stressed by the reinforcement member such as glass fiber so as to be protected appropriately. Since the part 4 is filled with the resin of the prepreg, the part 4 can be operated without fail under no glass fiber and powder dust.

In other words, since the part 4 is filled with the resin of the prepregs to be the insulating layers 12 and 14, the part 4 is not stressed by the glass fiber or the aramid fiber as the reinforcement fiber, and thus; appropriately protected. Moreover, since at least one hard insulating layer made of a prepreg reinforced by the glass fiber or the like is located in the vicinity of the part 4, the part 4 can be protected by external pressure and bending.

In these embodiment, when the rigid wiring board 1 is combined with the flexible wiring board 2 via the prepreg 14A, the conductive bumps 34A as the interlayer connection conductors 34 are formed on the flexible wiring board 2, not on the rigid wiring board 1 as described above with reference to FIGS. 5 and 11. Namely, the bottoms of the conductive bumps 34A are located on the flexible wiring board 2 and the tops of the conductive bumps 34A are faced for the rigid wiring board 1 as shown in FIGS. 2 to 4.

The interlayer connection conductors 34 is located between the wiring layers 24 and 25. The wiring layer 24 is formed on the hard insulating layer 13 and the wiring layer 25 is formed on the flexible insulating layer 15. Therefore, the forefronts of the conductive bumps are contacted with and deformed by the hard insulating layer 13 through the laminating and pressing so that the diameter of the bottom of each interlayer connection conductor becomes large and the diameter of the top of each interlayer connection conductor becomes small. In this case, the interlayer connection conductors 34 can be electrically connected with the wiring pattern 24 (connection lands 24) without fail. Moreover, since the bottoms of the interlayer connection conductors 34 are connected with the flexible wiring board, the diameters of the bottoms of the interlayer connection conductors 34 being larger than the diameters of the tops of the interlayer connection conductors 34, the flexible wiring board can not be deformed by the electrical connection of the interlayer connection conductors 34. In contrast, the interlayer connection conductors 34 are electrically connected with the rigid wiring board through the plastic deformation of the forefronts of the interlayer connection conductors 34. In this point of view, the rigid wiring board can be electrically connected with the flexible wiring board without fail via the interlayer connection conductors 34.

The conductive bumps may be formed on the rigid wiring board, but in this case, the above-described effect/function can not be exhibited.

In these embodiments, the part is mounted on the rigid board and embedded so that the manufacturing process can be simplified and the manufacturing reliability can be enhanced. In another case, the part may be mounted on the flexible board. In this case, however, since the solder cream and the conductive bumps are required to be formed on the same surface of the flexible board, the screen printing machine must be devised in order to realize the simultaneous formation of the solder cream and the conductive bumps so that the manufacturing process becomes complicated. In order to avoid the disadvantage, the conductive connection bumps may be formed on the rigid board. In this case, however, since the forefronts of the conductive bumps are connected with the flexible board, the flexible board may be plastically deformed while the forefronts of the conductive bumps are not plastically deformed. As a result, the rigid wiring board 1 may not be electrically connected with the flexible wiring board 2 without fail via the interlayer connection conductors 34.

Accordingly, the part is mounted on the first rigid board and the conductive bumps are formed on the flexible wiring board 2 so as to electrically connect the rigid wiring board and the flexible wiring board. Then, the second rigid board is prepared and the roll off to embed the part therein is formed at the second rigid board, and the conductive bumps are formed on the second rigid board so as to electrically connect the first rigid board and the second rigid board. According to these embodiments, the multilayered printed wiring board can be downsized while the number of part to be mounted is not decreased, and exhibit the hardness and flexibility simultaneously. Also, the reliability for the electrical connection of the multilayered printed wiring board can be enhanced.

Although the present invention was described in detail with reference to the above examples, this invention is not limited to the above disclosure and every kind of variation and modification may be made without departing from the scope of the present invention.

What is claimed is:

1. A multilayered printed wiring board, comprising:
   a flexible wiring board with wiring layers on both main surfaces thereof;
   a rigid wiring board with wiring layers on both main surfaces thereof;
   a first insulating layer sandwiched between said flexible wiring board and said rigid wiring board;
   a first interlayer connection conductor disposed through said first insulating layer so as to electrically connect said flexible wiring board and said rigid wiring board under the condition that a forefront of said first interlayer connection conductor is plastically deformed through the connection for said rigid wiring board and a bottom of said first interlayer connection conductor is connected with a connection land of said wiring layer of said flexible wiring board; and
   an electric/electronic component embedded in said rigid wiring board,
   wherein said rigid wiring board comprises:
      a first rigid board to mount said electric/electronic component on a main surface thereof;
      a second rigid board disposed opposite to said main surface of said first rigid board on which said electric/electronic component is mounted under the condition that a roll off to house said electric/electronic component is formed as a through-hole at said second rigid board;
      a second insulating layer disposed between said first rigid board and said second rigid board and surrounding said electric/electronic component so as to embed said roll off; and
      a second interlayer connection conductor disposed through said second insulating layer under the condition that a diameter of said second interlayer connection conductor in the side of said first rigid board is set smaller than a diameter of said second interlayer connection conductor in the side of said second rigid board, wherein said second rigid board of said rigid wiring board is connected with said flexible wiring board via said first insulating layer.

2. The multilayered printed wiring board as set forth in claim 1, wherein said electric/electronic component is embedded in a resin of a prepreg to be converted into said second insulating layer.

* * * * *